United States Patent
Salamone

(10) Patent No.: US 10,422,813 B2
(45) Date of Patent: Sep. 24, 2019

(54) MINIATURE HERMETIC ACCELERATION DETECTION DEVICE

(71) Applicant: CIRCOR AEROSPACE, INC., Hauppauge, NY (US)

(72) Inventor: Brent Salamone, Dix Hills, NY (US)

(73) Assignee: CIRCOR AEROSPACE, INC., Hauppauge, NY (US)

(*) Notice: Subject to any disclaimer, the term of this patent is extended or adjusted under 35 U.S.C. 154(b) by 142 days.

(21) Appl. No.: 15/238,988

(22) Filed: Aug. 17, 2016

(65) Prior Publication Data

US 2017/0059607 A1   Mar. 2, 2017

Related U.S. Application Data

(60) Provisional application No. 62/213,360, filed on Sep. 2, 2015.

(51) Int. Cl.
| | |
|---|---|
| *G01P 1/02* | (2006.01) |
| *G01P 15/18* | (2013.01) |
| *G01P 15/135* | (2006.01) |
| *G01P 15/08* | (2006.01) |

(52) U.S. Cl.
CPC .............. *G01P 15/18* (2013.01); *G01P 1/023* (2013.01); *G01P 15/135* (2013.01); *B81B 2203/055* (2013.01); *G01P 2015/082* (2013.01)

(58) Field of Classification Search
CPC ....... G01P 2015/0854; G01P 2015/084; G01P 2015/086; G01P 2015/0857; G01P 2015/0871; G01P 15/0891; G01P 15/135; G01P 15/18; H01H 2001/0068; H01H 35/14; H01H 35/141; F16F 2234/06; F16F 2238/026
See application file for complete search history.

(56) References Cited

U.S. PATENT DOCUMENTS

| | | | | |
|---|---|---|---|---|
| 2,993,100 | A * | 7/1961 | Maeder | G01P 15/135 200/61.53 |
| 4,789,762 | A * | 12/1988 | Miller | H01H 35/14 200/61.45 R |
| 5,254,059 | A * | 10/1993 | Arthur | A63B 21/026 482/52 |
| 5,811,910 | A * | 9/1998 | Cameron | G01P 15/0922 310/324 |
| 6,765,160 | B1 | 7/2004 | Robinson | |
| 7,159,442 | B1 * | 1/2007 | Jean | G01P 1/023 340/665 |
| 8,237,521 | B1 * | 8/2012 | Smith | G01P 15/0802 200/181 |
| 9,378,909 | B2 | 6/2016 | Gass et al. | |
| 2006/0219536 | A1 * | 10/2006 | Tay Eng Hock | G01P 15/0891 200/61.45 R |
| 2006/0220803 | A1 * | 10/2006 | Kranz | G01P 15/0891 340/426.24 |
| 2006/0272413 | A1 * | 12/2006 | Vaganov | G01P 15/123 73/514.01 |

(Continued)

*Primary Examiner* — Peter J Macchiarolo
*Assistant Examiner* — Alexander A Mercado
(74) *Attorney, Agent, or Firm* — McNees Wallace & Nurick LLC

(57) ABSTRACT

A MEMS acceleration detection device including a housing having a cavity and a spring mass system assembled into the cavity of the housing. A lid enclosing the spring mass system in the cavity and contacting a top surface of the housing.

19 Claims, 8 Drawing Sheets

(56) References Cited

U.S. PATENT DOCUMENTS

| | | | | |
|---|---|---|---|---|
| 2010/0108478 | A1* | 5/2010 | Zhe | G01P 15/08 |
| | | | | 200/61.45 R |
| 2011/0009773 | A1* | 1/2011 | Hower | G01D 21/00 |
| | | | | 600/578 |
| 2011/0203347 | A1* | 8/2011 | Hower | G01D 21/00 |
| | | | | 73/12.01 |
| 2012/0132001 | A1* | 5/2012 | Lu | G01P 15/125 |
| | | | | 73/504.14 |
| 2013/0081930 | A1* | 4/2013 | Shimoda | H01H 1/0036 |
| | | | | 200/61.45 R |
| 2013/0173209 | A1* | 7/2013 | Shimoda | G01P 15/00 |
| | | | | 702/141 |
| 2014/0033964 | A1* | 2/2014 | Frangi | G01P 15/04 |
| | | | | 116/201 |
| 2014/0076696 | A1* | 3/2014 | Currano | H01H 35/141 |
| | | | | 200/61.45 R |
| 2015/0185010 | A1* | 7/2015 | Lim | G01P 15/08 |
| | | | | 73/504.12 |
| 2016/0049270 | A1* | 2/2016 | Gass | H01H 35/141 |
| | | | | 200/61.53 |
| 2017/0059607 | A1* | 3/2017 | Salamone | G01P 1/023 |

\* cited by examiner

MINIATURE HERMETIC ACCELERATION DETECTION DEVICE

FIELD OF THE INVENTION

The present invention is directed to micro electromechanical systems devices as well as to an inexpensive method of manufacturing micro electromechanical systems detection devices.

BACKGROUND OF THE INVENTION

Micro electromechanical system (MEMS) switches are used in many applications. In one embodiment, the switch is a miniature acceleration switch which may be a single pole, single throw switch. The switch may be normally open or normally closed. Additionally, the switch may be hermetically sealed and may be momentary or latching. The switch is MEMS scale or near MEMS scale, meaning that the devices are very small, merging at or near the nano-scale into nanoelectromechanical systems or near nanoelectromechanical systems. MEMS scale is illustrated in FIG. 10.

Because of the ultraminiature size of MEMS devices, intricate manufacturing techniques are utilized to fabricate these devices. The prior art indicates that wafer fabrication technology and photolithographic technology are used to produce MEMS scale devices, making the initial production or development of such MEMS devices extremely expensive. Moreover, MEMS devices produced by these production methods are not amenable to configuration changes in device design or provide the ability to economically manufacture small numbers of different configurations of MEMS devices.

There is a need for MEMS devices and methods for manufacturing MEMS devices without the shortcomings of the prior art.

SUMMARY OF THE INVENTION

One embodiment of the present invention is directed to a MEMS acceleration detection device including a housing having a cavity and a spring mass system assembled into the cavity of the housing. The MEMS acceleration detection device further includes a lid enclosing the spring mass system in the cavity and contacting a top surface of the housing.

Another embodiment of the present invention is directed to a MEMS acceleration detection device including a housing having a cavity and a spring mass system assembled into the cavity of the housing. The spring mass system includes an annular ring surrounding a central mass and a spring positioned between the ring and the central mass, the annular ring in contact with a surface of the cavity. The MEMS acceleration detection device further includes a lid enclosing the spring mass system in the cavity and contacting a top surface of the housing.

Yet another embodiment of the present invention is directed to a method of manufacture of a MEMS acceleration detection device including providing a housing having a cavity and assembling a spring mass system into the cavity of the housing. The method further includes assembling a lid enclosing the spring mass system in the cavity and contacting a top surface of the housing.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The fabrication of MEMS scale devices, such as acceleration detection devices using more conventional manufacturing techniques, as set forth herein, can result in significant cost reductions for the devices while maintaining their reliability. By proper design, certain components of different MEMS devices may be common to the different designs, further reducing the cost and complexity of the MEMS or near MEMS devices. As used herein, the term "MEMS device" includes both MEMS scale or near MEMS scale devices, unless otherwise specified.

Figure 1:
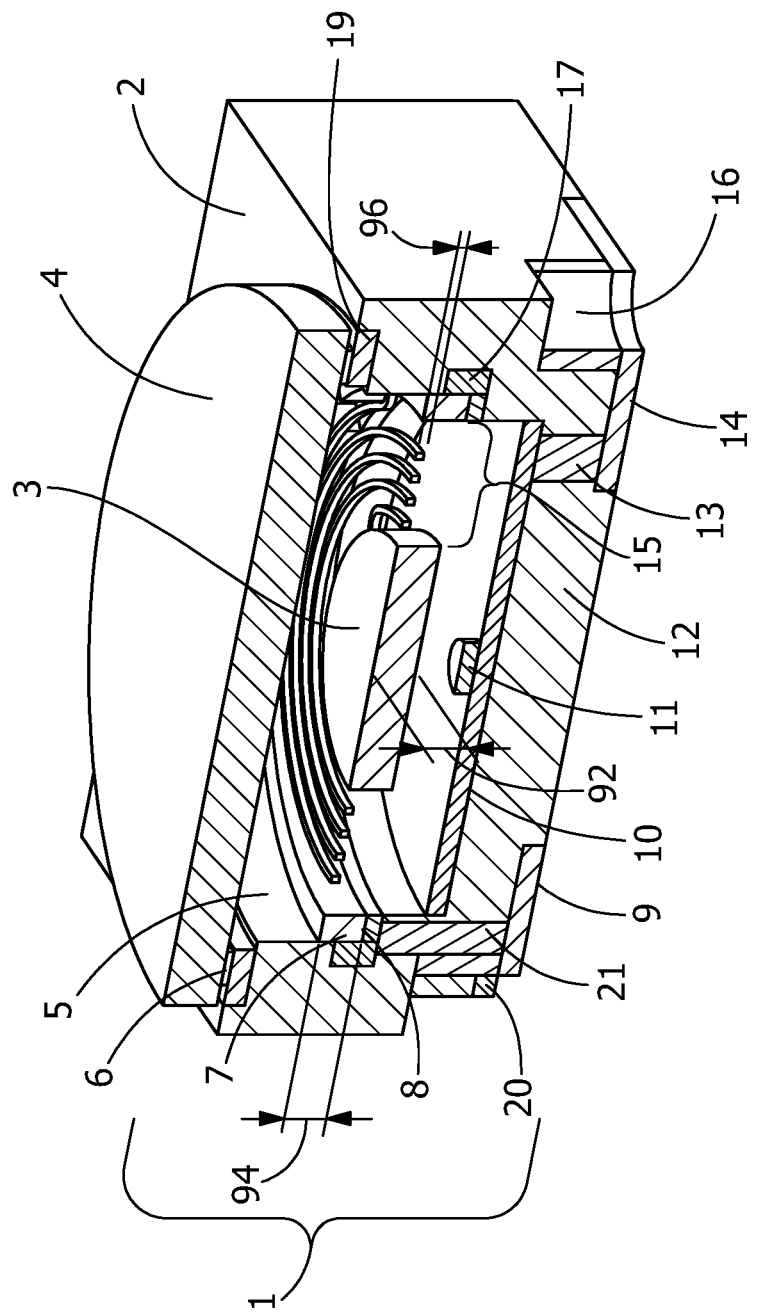
FIG. 1 is a front perspective view of a cross section of an exemplary MEMS device.
Figure 2:
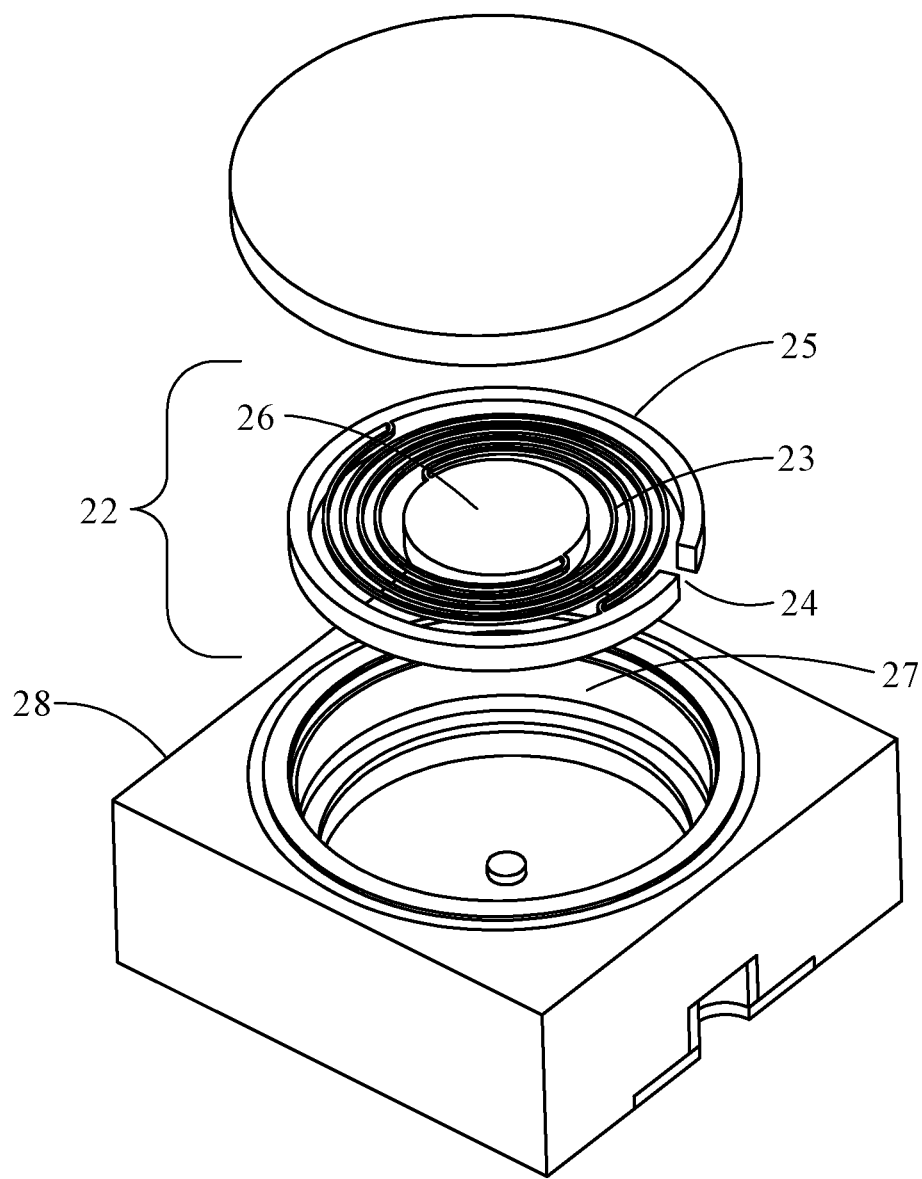
FIG. 2 is an exploded view of an exemplary MEMS device.
Figure 6:
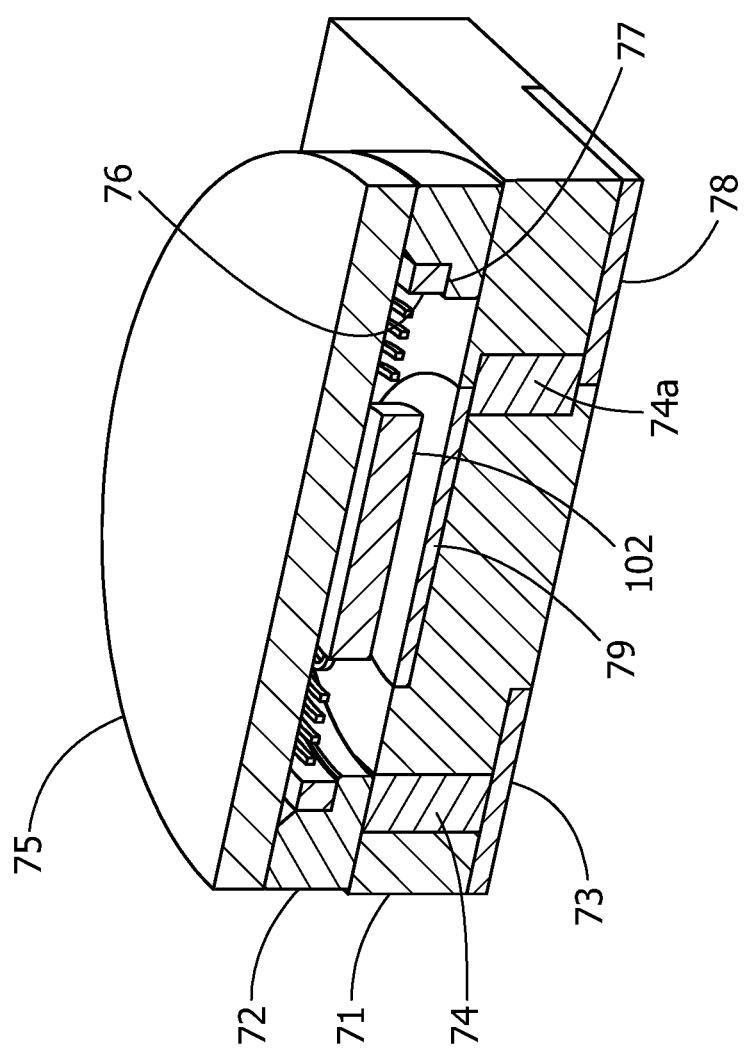
FIG. 6 is a front perspective view of a cross section of an exemplary MEMS device.

Referring now to FIG. 2, the MEMS devices (e.g., MEMS device 1, FIG. 1) contemplated herein comprise three components, a housing 28, a spring mass system 22 and a lid 4 (FIG. 1; see also FIG. 6, 75). The spring mass system 22 is installed in a cavity 5 (FIG. 1) of the housing, and the lid is affixed over the housing 28 after the spring mass system 22 has been installed.

Housing 28 is a ceramic-metallic structure. As set forth herein, the housing is comprised of a non-conductive portion and a conductive portion. Preferably, when the ceramic-metallic structure is co-fired, the non-conductive portion comprises alumina and the conductive portion comprises tungsten. Although currently co-firing the conductive portion and the non-conduction portion of the housing is the preferred method of manufacturing the housing, other methods for forming the housing may be utilized.

Figure 3:
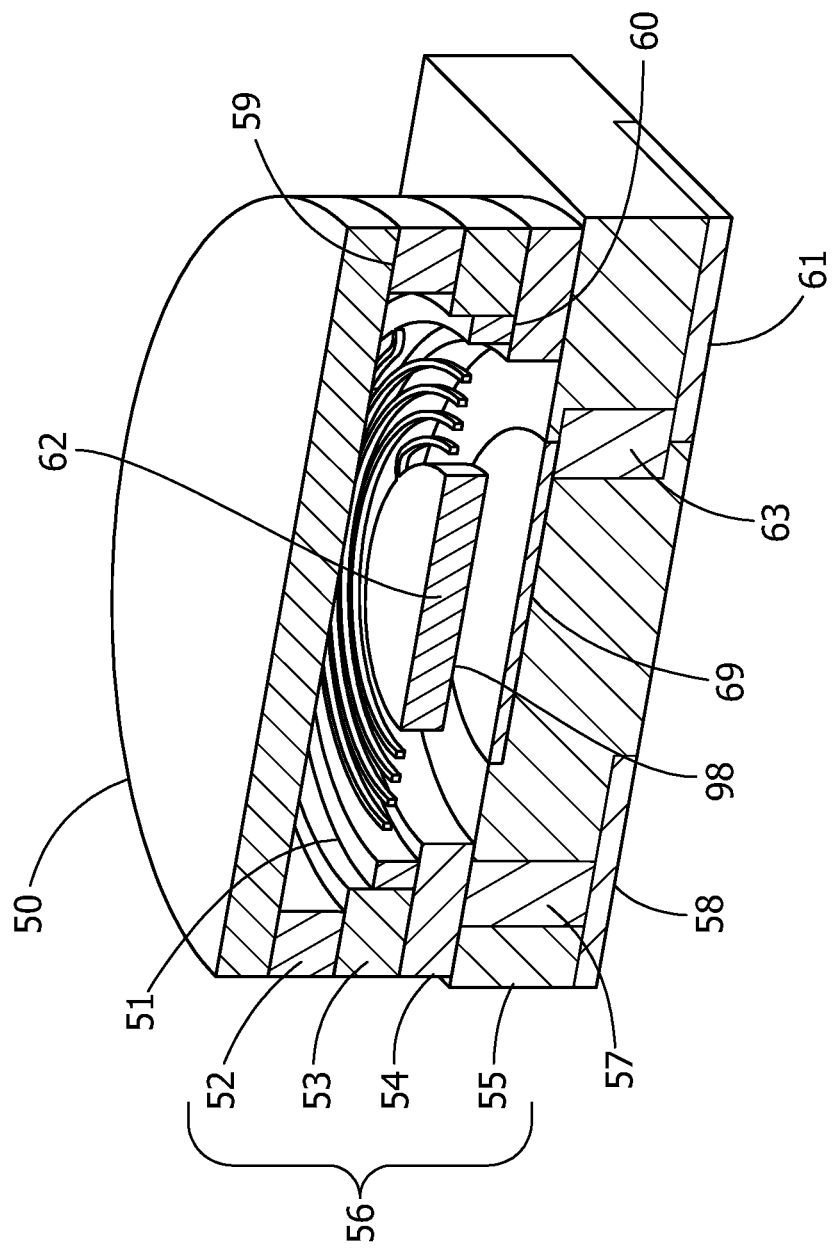
FIG. 3 is a front perspective view of a cross section of an exemplary MEMS device.
Figure 4:
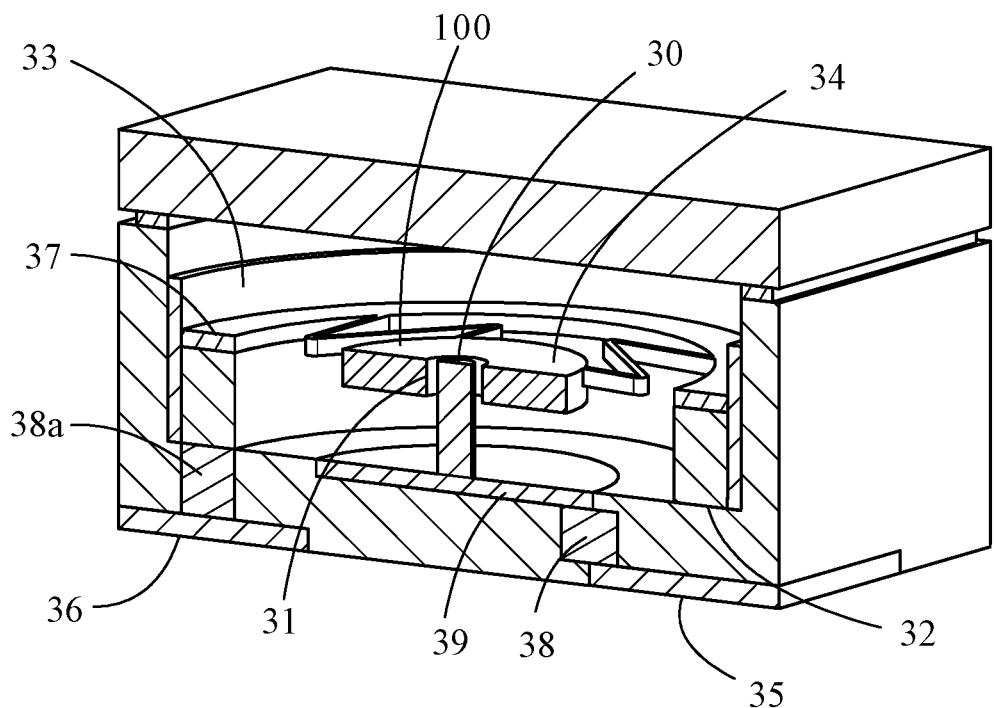
FIG. 4 is a front perspective view of a cross section of an exemplary MEMS device.
Figure 5:
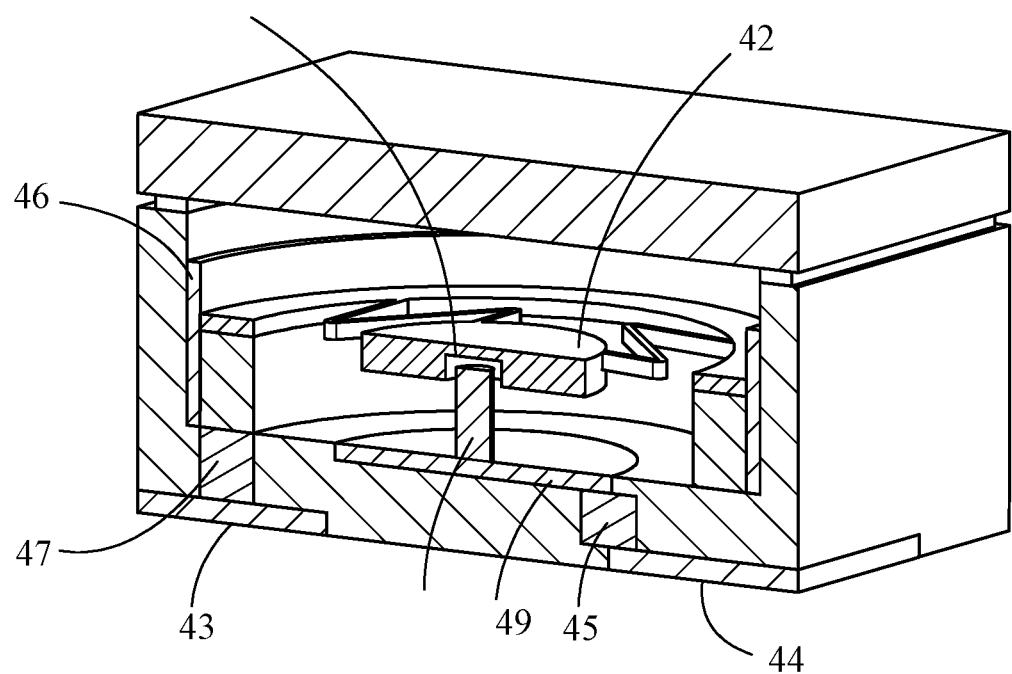
FIG. 5 is a front perspective view of a cross section of an exemplary MEMS device.
Figure 7:
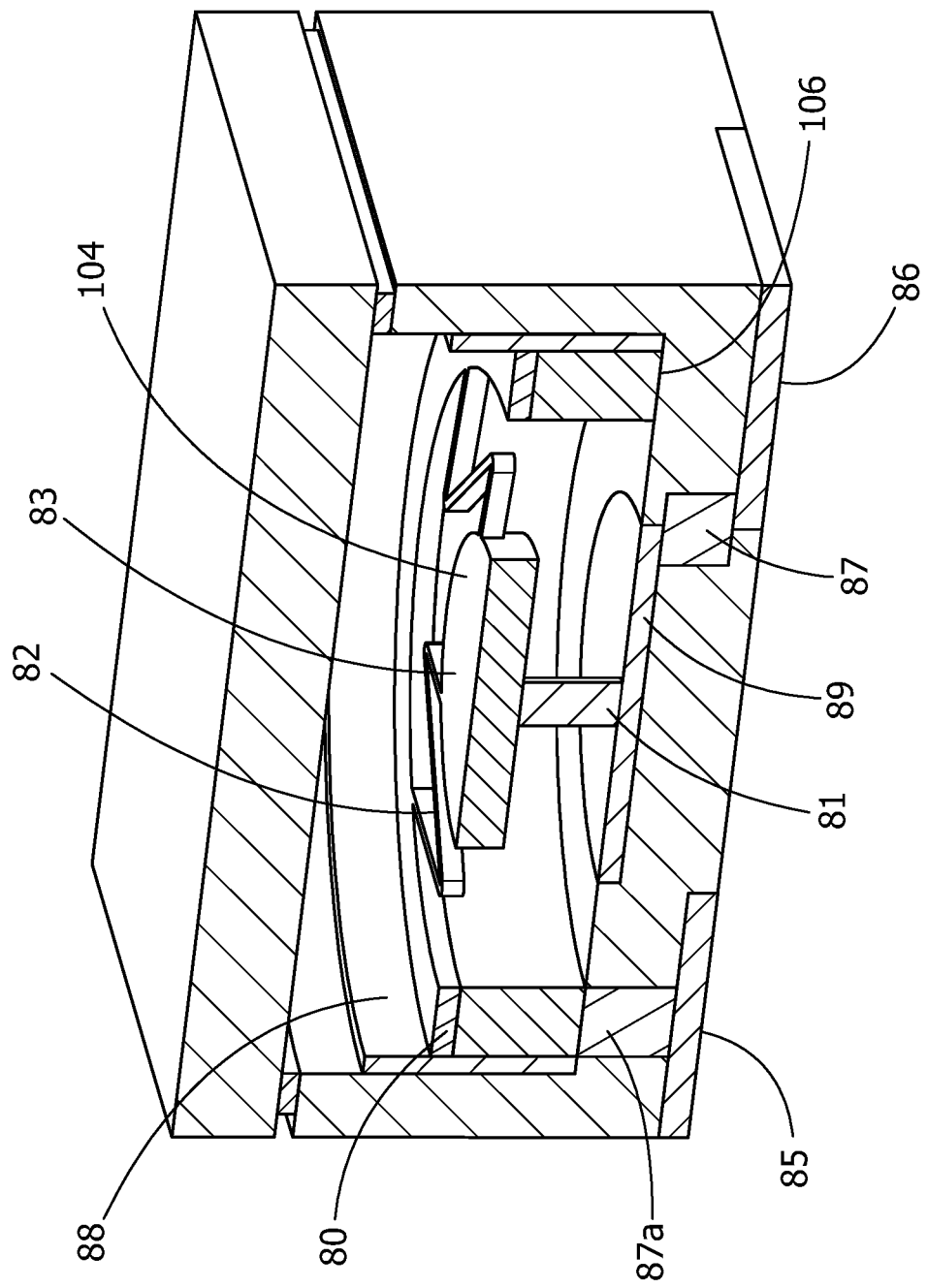
FIG. 7 is a front perspective view of a cross section of an exemplary MEMS device.

FIGS. 1, 3-7 and 9 depict housings having slightly different geometries. However, all of the housings have some common features. Each of the housings include at least two solder pads allowing the final assembled MEMS device to be surface mounted to a circuit board, see e.g., FIG. 1, 9, 14; FIG. 3, 58, 61; FIG. 4, 35, 36; FIG. 5, 43, 44; FIG. 6, 73, 78; FIG. 7, 85, 86. Optionally, as shown in FIG. 1, each of solder pads 9, 14 further includes respective shaped features, such as castellations 20, 16 to allow solder to flow upward and form a fillet for improving the solder joint. Each of the housings include a nonconductive portion, see e.g., FIG. 1, 12; FIG. 6, 71. Each of the housings depicted in FIGS. 1, 3-7 and 9 also includes a conductive layer overlying the nonconductive portion of the housing, see e.g., FIG. 1, 10, FIG. 3, 69; FIG. 4, 39; FIG. 5, 49; FIG. 6, 79; FIG. 7, 89. Each of the housings depicted in FIGS. 1, 3-7 and 9 also includes a first conductive via connecting the conductive layer to one the solder pads, see e.g., FIG. 1, 13; FIG. 3, 63; FIG. 4, 38; FIG. 5, 45; FIG. 6, 74a; and FIG. 7, 87. Each housing depicted in FIGS. 1, 3-7 and 9 also includes an annular conductive element see e.g., FIG. 1, 17; FIG. 3, 54, FIG. 4, 32, 33; FIG. 5, 46; FIG. 6, 72; FIG. 7, 88, 106 formed into an inner diameter of the housing (or forming an inner diameter and outer diameter of the housing; see e.g., FIG. 3, 54 and FIG. 6, 72) and spaced from the conductive layer formed in the housing by the non-conductive material of the housing, thereby electrically isolating the annular conductive element from the conductive layer. A second conductive via, see e.g., FIG. 1, 21; FIG. 3, 57; FIG. 4, 38a; FIG. 5, 47; FIG. 6, 74; FIG. 7, 87a, formed into the housing connects the annular conductive element to one of the solder pads, the second via being connected to a different solder pad than the first via. This arrangement enables an electrical circuit to be formed under certain conditions, as will be explained. Each of the housings include a cavity above the conductive layer overlying the non-conductive portion (see e.g., FIG. 1, 5; FIG. 2, 27).

While the housings include a number of common elements, in the embodiments shown in FIGS. 1, 3-7 and 9, there are some differences. The housing 2 of FIG. 1 further includes a conductive ring 19 formed in the top of the housing (to which lid 4 is secured by solder joint 6), and a conductive annular step 8 that makes electrical connection with a conductive annular layer 17 of the housing 2. Housing 56 (FIG. 3) further includes an annular conductive layer 53 disposed over annular conductive element 54 (that is disposed over non-conductive portion 55), both of which may be a nickel iron alloy such as kovar, and an annular non-conductive element 52 disposed over annular conductive element 53. Other geometric differences are shown in FIGS. 1, 3-7 and 9 and explained in the disclosure.

Each of the devices in FIGS. 1, 3-7 and 9 includes a spring mass system or assembly, which varies in the embodiments shown in the Figures. For purposes herein, the term "spring mass assembly" and "spring mass system" and the like may be used interchangeably. The spring mass assemblies or spring mass systems and their interaction with the housing are different, depending on whether the switch will be an x-y switch that reacts to horizontal, planer forces, a z-switch that reacts to vertical forces or an x-y-z switch that reacts to omni-directional forces. The spring mass system or assembly 22 is shown in FIG. 2 and comprises a central mass 26, an annular ring 25 (or 7 in FIG. 1) surrounding central mass 26 and a spring 23 (or 15 in FIG. 1) interposed or positioned between central mass 26 and annular ring 25. The spring mass assembly or system is a separate component of the device. The spring mass assembly may be press fit into the housing by inserting it into the housing cavity. Preferably, annular ring 25 includes a split 24 enabling compression of the assembly so that spring mass assembly 22 can be assembled into cavity 27 (or 5 in FIG. 1). Once assembled, when the compression force is removed from annular ring 25, the ring moves out (radially outwardly) against the inner diameter (cavity surface) of the housing 28, engaging the housing with an interference fit and holding the spring mass assembly in place.

Figure 8:
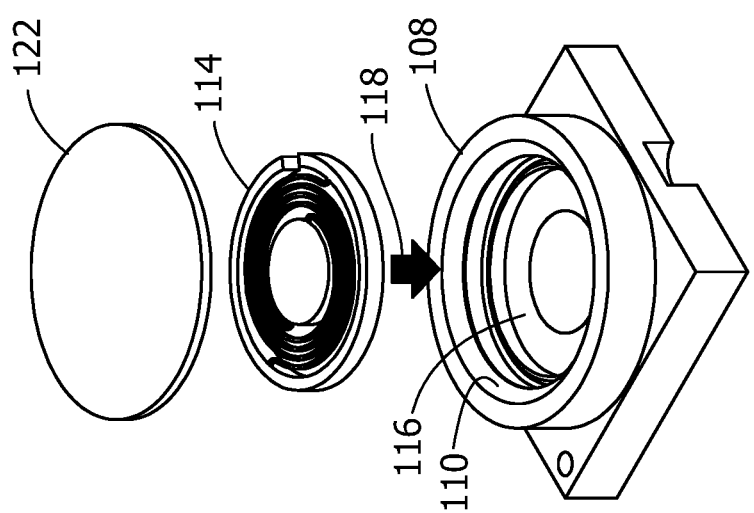
FIG. 8 is an exploded view of an exemplary MEMS device.
Figure 10:
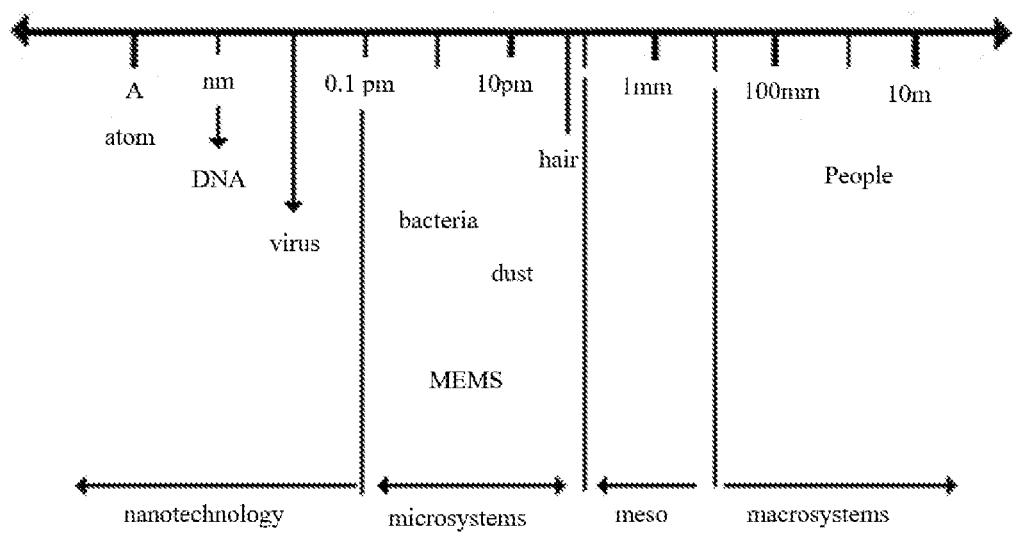
FIG. 10 is a chart of a MEMS scale.

Alternately, during assembly and after completion of assembly, a compression force is continuously applied to annular ring 25, as a result of spring mass system 22 being pressed into cavity 27. That is, as more clearly shown in FIGS. 8 and 9, a housing 108 has a chamfer 110 formed and positioned along an entrance to a cavity 116. The size of cavity 116 is less than the size of spring mass system 114 in an uncompressed condition. Once a spring mass system 114 is aligned with the entrance to cavity 116 of housing 108, the spring mass system 114 is directed in direction 118 into housing 108. Annular ring 112 of spring mass system 114 is brought into sliding contact with chamfer 110. In response to a surface, such as an outer surface of annular ring 112 of spring mass system 114 being brought into sliding contact with the chamfer 110 during assembly of the spring mass system 114 into the cavity 116, chamfer 110 exerts a force directed toward a central mass 120 partially closing the split 24 (FIG. 2), resulting in annular ring 112 being in a compressed condition, annular ring 112 being maintained in the compressed condition after the spring mass system 114 is assembled into cavity 116.

Figure 9:
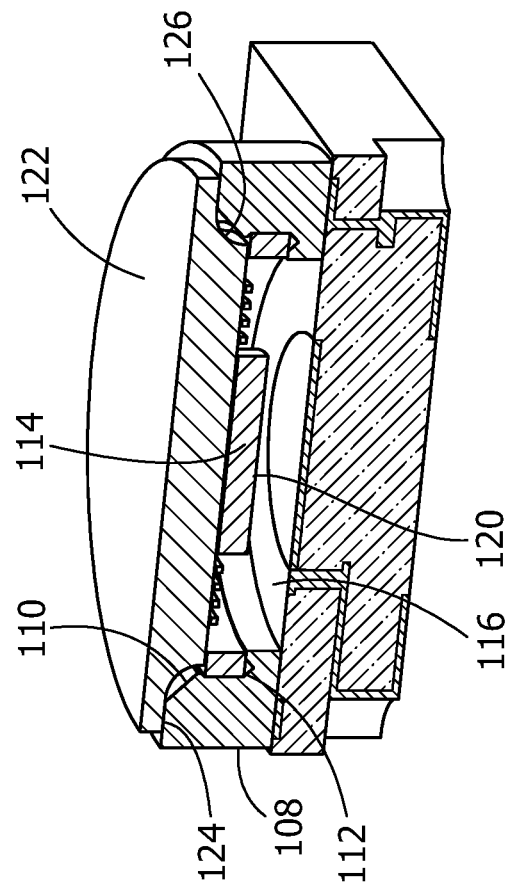
FIG. 9 is a front perspective view of a cross section of the MEMS device of FIG. 8.

As further shown in FIG. 9, the lid has a feature for assisting with assembly of the MEMS device. That is, a lid 122 has a first surface 124 including a stepped surface 126. Once spring mass system 114 has been directed into and assembled in cavity 116, lid 122 is generally aligned with the entrance of cavity 116, with first surface 124 facing the top surface of housing 108, and lid 122 is directed in direction 118 toward housing 108. Stepped surface 126 is received by chamfer 110 of housing 108 for aligning the lid with the housing during assembly. That is, by virtue of stepped surface 126 being guidingly received by chamfer 110, lid 122 and cavity 116 can be assembled together with precision, while permitting reduced alignment precision between lid 122 and housing 108.

Preferably, the assembled spring mass assembly or system contacts at least two housing surfaces, such as an annular or radial surface of the housing and a non-radial or non-annular surface of the housing, each housing surface forming a portion of the cavity surface into which the spring mass system is assembled. For example, in FIG. 1, annular ring 7 of spring mass system 90 forms an interference fit with at least one radial surface of annular conductive element 17 and housing 2, as well as contacting a non-radial surface of conductive annular step 8. In FIG. 3, annular ring 51 of spring mass system 98 forms an interference fit with a radial surface of annular conductive element 53, as well as contacting a non-radial surface 60 of annular conductive element 54. In FIG. 4, annular ring 37 of spring mass system 100 forms an interference fit with a radial surface of annular conductive element 33, as well as contacting a non-radial surface of annular conductive element 32. In FIG. 6, annular ring 76 of spring mass system 102 forms an interference fit with a radial surface of annular conductive element 72, as well as contacting a non-radial surface 77 of annular conductive element 72. In FIG. 7, annular ring 80 of spring mass system 104 forms an interference fit with a radial surface of annular conductive element 88, as well as contacting a non-radial surface of annular conductive element 106.

The spring mass assembly may be formed by any convenient process. Although the spring is shown as a spiral spring, the spring is not restricted to a spiral spring and any spring or combination of springs that provides the desired movement of the central mass 26 may be used. The spring mass and spring coefficient are selected to provide the desired force that provides the rating for the device. For example, a higher spring coefficient is selected when a device requiring a high force for activation is required.

The spring mass system can be tailored to suit a particular application. As shown in FIG. 1 for spring mass system 90, for example, central mass 3 has a thickness 92, annular ring 7 has a thickness 94, and spring 15 has a thickness 96. In one embodiment, thicknesses 92, 94, 96 can be equal to each other. In one embodiment, two of the thicknesses of 92, 94, 96 can be equal to each other. In one embodiment, each of thicknesses 92, 94, 96 can be different from each other. In one embodiment, at least portions of thickness 96 of spring 15 can be different than other portions of spring 15, such as incrementally increasing thickness or other variations.

The spring mass assembly may be fabricated by any conventional fabrication technique. Thus a spring mass assembly may be stamped from a sheet of material. Alternatively, each of the components of the spring mass assembly may be formed separately and joined together by a braze or welding operation. Thus the spring mass may be formed by one technique, for example stamping, forging or machining, while the spring and the annular ring may be fabricated by chemical etching or electroforming.

FIG. 1 depicts a vertical switch. Conductive layer 10 includes a protrusion 11. Protrusion 11 may be formed as part of conductive layer 10 during co-firing. Alternatively, conductive layer 10 may include an aperture formed as part of a standard housing assembly, and a conductive protrusion may be shrink fit or press fit into the aperture formed in conductive layer 10 as required by the configuration of the spring mass assembly and whether the switch is a planar switch, a vertical switch or an omni-directional switch. The extension of the conductive protrusion 11 above conductive layer 10 may be altered based on force so that the spring constant does not have to be changed In the device shown in FIG. 1, when the force applied to the device is sufficient to urge or move central mass 3 downward so that it contacts conductive protrusion 11, a circuit is closed and a signal may be sent through the device and through a circuit board indicating that a force has been applied that meets or exceeds the design force of the device. Thus, the device shown in FIG. 1 illustrates a vertical or z-axis device. FIG. 3 illustrates a vertical or z-axis device without the protrusion. In FIG. 3, the circuit is closed, that is, the device is activated, when sufficient force is applied to cause central mass 62 to contact conductive layer 69.

FIG. 4 illustrates a planar or x-y device. In this device, when sufficient force is applied in the x direction, y direction, or some component or combination thereof, central mass 34 urged into movement to contact conductive protrusion 30 that extends into an aperture 31 in the center of central mass 34. On contact between the central mass and the conductive protrusion, the circuit is closed. FIG. 5 illustrates an omni-directional or x-y-z device. In this embodiment, conductive protrusion 41 extends into an aperture 40 in the center of central mass 42, but the aperture does not extend completely through the thickness of the center mass. In this embodiment, the circuit will close when a sufficient force is applied in the x direction, y direction or combination thereof, identical to operation of the device of FIG. 4 discussed above. However, the circuit will also close when a sufficient force or a component of sufficient force in the z direction is applied, causing the conductive protrusion to contact the top of the aperture in the center of central mass 42, closing the circuit. That is, the circuit will close when a sufficient force is applied in the x direction, y direction, z direction or a combination thereof.

FIG. 7 illustrates a switch in which the circuit is closed, as the central mass 83 is always in contact with conductive protrusion 81. When sufficient force is applied to urge or move central mass 83 out of contact with protrusion 81, the circuit opens and a signal is sent through the device and through a circuit board indicating that a force has been applied that meets or exceeds the design force of the device.

Each of the illustrated devices, such as shown in FIG. 1, also includes a lid 4 that interfaces with a top surface of housing 2. The lid is a metallic material, such as kovar and allows the cavity portion of the device to be evacuated or provided with an inert, protective environment using an inert gas. The lid may be assembled to the housing by any convenient means which may include soldering, brazing, welding, adhesives and the like. For example, as shown in FIG. 1, lid 4 is assembled to the top surface of housing 2 by a joint 6, or as shown in FIG. 3, lid 50 is assembled to the facing surface of non-conductive element 52 of housing 56 by a joint 59. The method of attachment may also include mechanical methods such as threaded attachment when a suitable seal is provided between the housing and the lid.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A MEMS acceleration detection device comprising:
   a housing having a cavity, the housing laterally surrounding the cavity;
   a spring mass system assembled into the cavity of the housing, the spring mass system having an annular ring including an at least partially closable split, the annular ring having a single peripheral surface facing and in non-moving contact with a corresponding surface of the cavity during operation of the device, the housing laterally surrounding and maintaining in lateral contact the spring mass system along the peripheral surface; and
   a lid enclosing the spring mass system in the cavity and contacting a top surface of the housing.

2. The device of claim 1, wherein upon assembly, the spring mass system maintains an interference fit with the cavity.

3. The device of claim 1, wherein the housing includes a chamfer formed along an entrance to the cavity, the lid having a first surface facing the top surface of the housing, the first surface including a stepped surface received by the chamfer for aligning the lid with the housing during assembly.

4. The device of claim 1, wherein the spring mass system comprises:
   the annular ring surrounding a central mass; and
   a spring positioned between the annular ring and the central mass, the annular ring in contact with a surface of the cavity.

5. The device of claim 4, wherein the central mass is urged into contact with at least one of a non-protruding surface in the cavity and a protrusion positioned in the cavity in response to a sufficient force in a z direction.

6. The device of claim 4, wherein the central mass is urged into contact with a protrusion positioned in the cavity in response to a sufficient force an x direction, y direction or a combination thereof.

7. The device of claim 4, wherein the central mass is urged into contact with a protrusion positioned in the cavity in response to a sufficient force in an x direction, y direction, z direction or a combination thereof.

8. The device of claim 4, wherein the split is partially closable in response to forces applied to an outer surface of the annular ring toward the central mass.

9. The device of claim 8, wherein the housing includes a chamfer formed along an entrance to the cavity, a size of the cavity being less than a size of the annular ring of the spring mass system in an uncompressed condition;
wherein in response to the annular ring of the spring mass system being brought into sliding contact with the chamfer during assembly of the spring mass system into the cavity, the chamfer exerts a force partially closing the split, resulting in the annular ring being in a compressed condition, the annular ring being maintained in the compressed condition after the spring mass system is assembled into the cavity.

10. A MEMS acceleration detection device comprising:
a housing having a cavity, the housing laterally surrounding the cavity; and
a spring mass system assembled into the cavity of the housing, the spring mass system having an annular ring including an at least partially closable split, the annular ring having a single peripheral surface facing and in non-moving contact with a corresponding surface of the cavity during operation of the device, the housing laterally surrounding and maintaining in lateral contact the spring mass system along the peripheral surface;
the spring mass system comprising:
the annular ring surrounding a central mass; and
a spring positioned between the annular ring and the central mass, the annular ring in contact with a surface of the cavity; and
a lid enclosing the spring mass system in the cavity and contacting a top surface of the housing, the housing including a chamfer formed along an entrance to the cavity, the lid having a first surface facing the top surface of the housing, the first surface including a stepped surface received by the chamfer for aligning the lid with the housing during assembly.

11. The device of claim 10, wherein the annular ring includes an at least partially closable split, the split being partially closable in response to forces applied to an outer surface of the annular ring toward the central mass.

12. The device of claim 10, wherein the central mass is urged into contact with at least one of a non-protruding surface of the cavity and a protrusion positioned in the cavity in response to a sufficient force in a z direction.

13. The device of claim 10, wherein the central mass is urged into contact with a protrusion positioned in the cavity in response to a sufficient force in an x direction, y direction or a combination thereof.

14. The device of claim 10, wherein the central mass is urged into contact with a protrusion positioned in the cavity in response to a sufficient force in an x direction, y direction, z direction or a combination thereof.

15. The device of claim 11, wherein the housing includes the chamfer formed along an entrance to the cavity, a size of the cavity being less than a size of the annular ring of the spring mass system in an uncompressed condition;
wherein in response to the annular ring of the spring mass system being brought into sliding contact with the chamfer during assembly of the spring mass system into the cavity, the chamfer exerts a force partially closing the split, resulting in the annular ring being in a compressed condition, the annular ring being maintained in the compressed condition after the spring mass system is assembled into the cavity.

16. A method of manufacture of a MEMS acceleration detection device comprising:
providing a housing having a cavity, the housing laterally surrounding the cavity;
assembling a spring mass system into the cavity of the housing, the spring mass system having an annular ring including an at least partially closable split, the annular ring having a single peripheral surface facing and in non-moving contact with a corresponding surface of the cavity during operation of the device, the housing laterally surrounding and maintaining in lateral contact the spring mass system along the peripheral surface; and
assembling a lid enclosing the spring mass system in the cavity and contacting a top surface of the housing.

17. The method of claim 16, wherein assembling the spring mass system into the cavity of the housing results in an interference fit between the spring mass system and the cavity.

18. The method of claim 16, wherein assembling the spring mass system into the cavity of the housing further comprises:
slidably contacting the annular ring of the spring mass system with a chamfer formed along an entrance to the cavity, the chamfer exerting a force partially closing the split formed in the annular ring, resulting in the annular ring being in a compressed condition, the annular ring being maintained in the compressed condition after the spring mass system is assembled into the cavity.

19. The method of claim 16, wherein assembling the lid enclosing the spring mass system in the cavity further comprises:
aligning the lid with the housing during assembly, wherein the housing including a top surface and a chamfer formed along an entrance to the cavity, the lid having a first surface facing the top surface of the housing, the first surface including a stepped surface received by the chamfer during assembly.

* * * * *